(12) United States Patent
Etou et al.

(10) Patent No.: US 8,487,801 B2
(45) Date of Patent: Jul. 16, 2013

(54) ANALOG-TO-DIGITAL CONVERTER AND SIGNAL PROCESSING SYSTEM

(75) Inventors: Shinichirou Etou, Nagasaki (JP); Yasuhide Shimizu, Nagasaki (JP); Kouhei Kudou, Nagasaki (JP); Yukitoshi Yamashita, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/435,178

(22) Filed: Mar. 30, 2012

(65) Prior Publication Data

US 2012/0268300 A1   Oct. 25, 2012

(30) Foreign Application Priority Data

Apr. 20, 2011  (JP) ................................ 2011-094214

(51) Int. Cl.
  *H03M 1/12* (2006.01)
(52) U.S. Cl.
  USPC ........... 341/156; 341/136; 341/160; 341/140; 341/154; 341/130
(58) Field of Classification Search
  USPC .................................................. 341/130–160
  See application file for complete search history.

(56) References Cited

U.S. PATENT DOCUMENTS

| 4,733,217 | A * | 3/1988 | Dingwall ....................... 341/122 |
| 5,353,027 | A * | 10/1994 | Vorenkamp et al. .......... 341/156 |
| 5,489,904 | A * | 2/1996 | Hadidi ........................... 341/156 |
| 6,583,747 | B1 * | 6/2003 | van der Goes et al. ....... 341/156 |
| 6,653,966 | B1 * | 11/2003 | van der Goes et al. ....... 341/156 |
| 7,324,038 | B2 * | 1/2008 | van der Goes et al. ....... 341/156 |
| 2007/0132629 | A1 | 6/2007 | Van Der Ploeg |
| 2012/0194364 | A1 * | 8/2012 | Chio et al. .................... 341/110 |

FOREIGN PATENT DOCUMENTS

JP   2007-509564 A   4/2007

* cited by examiner

*Primary Examiner* — Lam T Mai
(74) *Attorney, Agent, or Firm* — Rader, Fishman & Grauer PLLC (57) ABSTRACT

An analog-to-digital (A/D) converter includes: a coarse A/D converter configured to convert, when converting an analog input signal into an N-bit digital signal, the analog input signal into a high-order m-bit digital signal; a fine A/D converter configured to convert the analog input signal into a low-order n-bit (where n=N−m) digital signal based on a conversion result of the coarse A/D converter; and a track-and-hold (TH) circuit configured to sample the analog input signal, to supply a comparison voltage compared with a coarse reference voltage to the coarse A/D converter, and to supply a comparison voltage compared with a fine reference voltage based on a conversion result of the fine A/D converter to the fine A/D converter. The TH circuit is configured to share a sampling capacitor in a selective input path for the analog input signal, the coarse reference voltage, and the fine reference voltage.

10 Claims, 6 Drawing Sheets

ANALOG-TO-DIGITAL CONVERTER AND SIGNAL PROCESSING SYSTEM

BACKGROUND

The present disclosure relates to an analog-to-digital (A/D) converter that converts an analog signal into a digital signal at high speed and also relates to a signal processing system.

As systems best suited for analog-to-digital (A/D) conversion at high speed, parallel A/D conversion and serial-parallel A/D conversion have been known.

For conversion of an analog input signal (voltage) into an N-bit digital signal, parallel A/D converters have a reference circuit that supplies an N-bit reference voltage and a comparator group that compares the reference voltage supplied from the reference circuit with the analog input signal.

In addition, the parallel A/D converters have an encode unit that converts an analog signal into a digital signal and a timing generator that controls the whole timing.

Serial-parallel A/D converters basically have a multiplexer composed of a switch group besides a parallel A/D converter.

Meanwhile, as serial-parallel A/D converters, sub-ranging A/D converters having a coarse A/D converter (CADC) and a fine A/D converter (FADC) have been known. In the sub-ranging A/D converters, A/D conversion is first coarsely performed by the CADC and then finely performed by the FADC.

Figure 1:
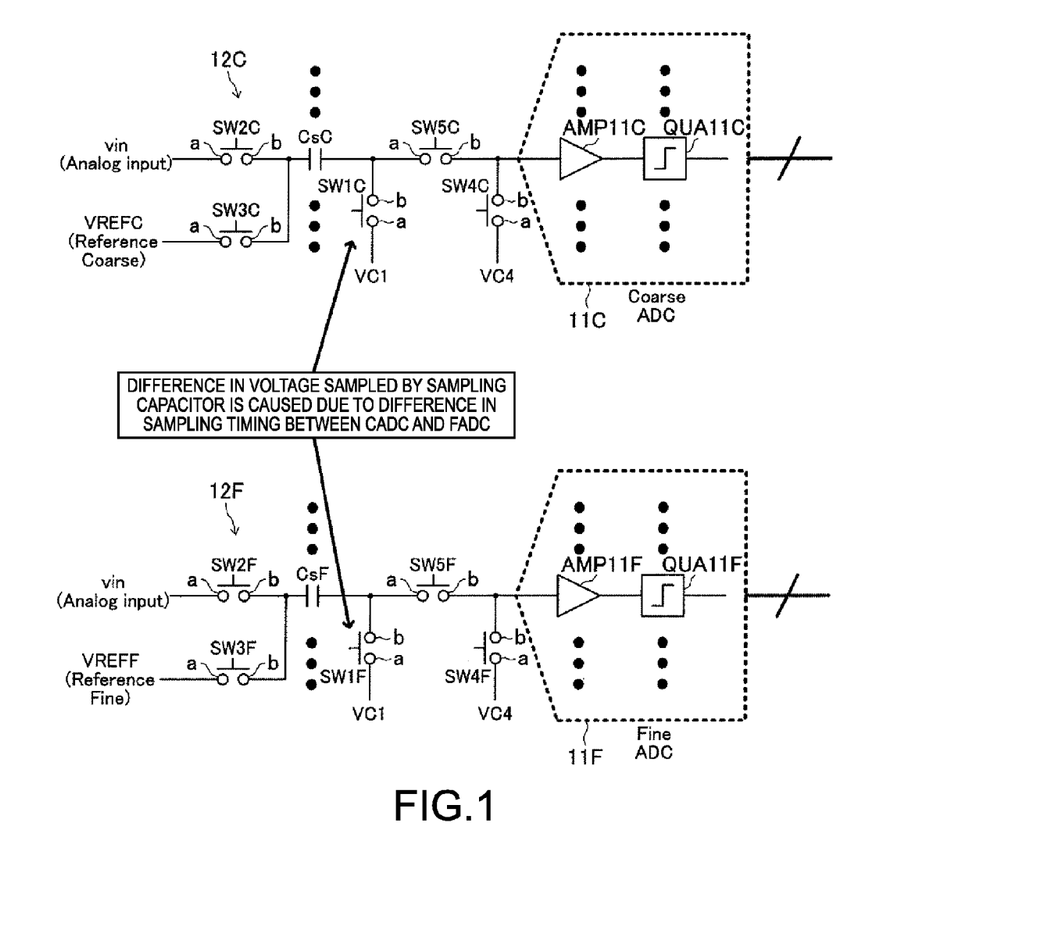
FIG. 1 is a diagram showing a configuration example of TH circuits of a coarse A/D converter and a fine A/D converter of a sub-ranging A/D converter.

FIG. 1 is a diagram showing a configuration example of the TH circuits of the coarse A/D converter and the fine A/D converter of a sub-ranging A/D converter.

At the input stage of a coarse A/D converter (CADC) 11C, a track-and-hold (TH) circuit 12C for the CADC is disposed. At the input stage of a fine A/D converter (FADC) 11F, a TH circuit 12F for the FADC is disposed.

The coarse A/D converter 11C includes an amplifier AMP11C and a quantization circuit (binarization circuit) QUA11C. The fine A/D converter 11F includes an amplifier AMP11F and a quantization circuit (binarization circuit) QUA11F.

The TH circuit 12C for the CADC includes switches SW1C to SW5C and a sampling capacitor CsC.

The switch SW1C has its terminal a connected to the supply line for a voltage VC1 and its terminal b connected to the terminal a of the switch SW5C and one end (first electrode) of the sampling capacitor CsC.

The switch SW2C has its terminal a connected to the supply line for an analog input signal vin and its terminal b connected to the other end (second electrode) of the sampling capacitor CsC.

The switch SW3C has its terminal a connected to the supply line for a coarse reference voltage VREFC supplied from a reference circuit (not shown) and its terminal b connected to the other end (second electrode) of the sampling capacitor CsC.

The switch SW4C has its terminal a connected to the supply line for a voltage VC4 and its terminal b connected to the terminal b of the switch SW5C and the input of the coarse A/D converter 11C.

It should be noted that the reference circuit is composed of a resistor ladder including a plurality of resistors R connected in series between a power supply VRT on a high potential side and a power supply VRB on a low potential side.

In the TH circuit 12C for the CADC, the analog input signal vin is sampled when only the switches SW1C, SW2C, and SW4C are turned on.

Then, a comparison voltage compared with the coarse reference voltage VREFC is supplied from the reference circuit to the amplifier AMP11C of the subsequent coarse A/D converter 11C when only the switches SW3C and SW5C are turned on.

The TH circuit 12F for the FADC includes switches SW1F to SW5F and a sampling capacitor CsF.

The switch SW1F has its terminal a connected to the supply line for the voltage VC1 and its terminal b connected to the terminal a of the switch SW5C and one end (first electrode) of the sampling capacitor CsF.

The switch SW2F has its terminal a connected to the supply line for the analog input signal vin and its terminal b connected to the other end (second electrode) of the sampling capacitor CsF.

The switch SW3F has its terminal a connected to the supply line for a fine reference voltage VREFF selected by a multiplexer (not shown) with the output of the coarse A/D converter 11C and its terminal b connected to the other end (second electrode) of the sampling capacitor CsF.

The switch SW4F has its terminal a connected to the supply line for the voltage VC4 and its terminal b connected to the terminal b of the switch SW5F and the input of the fine A/D converter 11F.

In the TH circuit 12F for the FADC, the analog input signal vin is sampled when only the switches SW1F, SW2F, and SW4F are turned on.

Then, the comparison voltage compared with the fine reference voltage VREFF is supplied to the amplifier AMP11F of the subsequent fine A/D converter 11F when only the switches SW3F and SW5F are turned on.

SUMMARY

However, as described above, the sub-ranging A/D converter has the TH circuit 12C for the CADC and the TH circuit 12F for the FADC. This results in an increase in the cell area of the sub-ranging A/D converter.

In addition, the following disadvantages are caused by fluctuations in the switches SW2C and SW2F, the switches SW1C and SW1F, and the sampling capacitors CsC and CsF of the TH circuits 12C and 12F and also caused by the skew of timing for turning on and off the switches SW1C and SW1F.

More specifically, there is a difference in the analog signal sampled by the sampling capacitor between the FADC and the CADC due to the fluctuations in the switches and the capacitors of the TH circuits 12C and 12F and also due to the skew of switching.

In view of the above circumstances, there is a need for providing an A/D converter and a signal processing system capable of preventing an increase in area and reducing a difference in sampled analog signal between a coarse AD converter and a fine A/D converter.

According to a first embodiment of the present disclosure, there is provided an analog-to-digital (A/D) converter including a coarse analog-to-digital (A/D) converter, a fine analog-to-digital (A/D) converter, and a track-and-hold (TH) circuit. The coarse A/D converter is configured to convert, when converting an analog input signal into an N-bit digital signal, the analog input signal into a high-order m-bit digital signal. The fine A/D converter is configured to convert the analog input signal into a low-order n-bit (where n=N−m) digital signal based on a conversion result of the coarse A/D converter. The TH circuit is configured to sample the analog input signal, to supply a comparison voltage compared with a coarse reference voltage to the coarse A/D converter, and to supply a comparison voltage compared with a fine reference voltage based on a conversion result of the fine A/D converter to the fine A/D converter. The TH circuit is configured to share a sampling capacitor in a selective input path for the analog input signal, the coarse reference voltage, and the fine reference voltage.

According to a second embodiment of the present disclosure, there is provided a signal processing system including an analog-to-digital (A/D) converter configured to convert an analog signal supplied from an analog signal processing system into a digital signal. The A/D converter includes a coarse analog-to-digital (A/D) converter, a fine analog-to-digital (A/D) converter, and a track-and-hold (TH) circuit. The coarse A/D converter is configured to convert, when converting an analog input signal into an N-bit digital signal, the analog input signal into a high-order m-bit digital signal. The fine A/D converter is configured to convert the analog input signal into a low-order n-bit (where n=N−m) digital signal based on a conversion result of the coarse A/D converter. The TH circuit is configured to sample the analog input signal, to supply a comparison voltage compared with a coarse reference voltage to the coarse A/D converter, and to supply a comparison voltage compared with a fine reference voltage based on a conversion result of the fine A/D converter to the fine A/D converter. The TH circuit is configured to share a sampling capacitor in a selective input path for the analog input signal, the coarse reference voltage, and the fine reference voltage.

According to an embodiment of the present disclosure, it is possible to prevent an increase in area and reduce a difference in sampled analog signal between a coarse AD converter and a fine A/D converter.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

It should be noted that the description will be given in the following order.
(1) Basic Configuration Example of Sub-Ranging A/D Converter
(2) Configuration Example of TH Circuit Serving As Substantial Part of Sub-Ranging A/D Converter
(3) Configuration Example of Signal Processing System (1) Basic Configuration Example of Sub-Ranging A/D Converter FIG. 2 is a diagram showing a basic entire configuration example of a sub-ranging A/D converter according to the embodiment.

The sub-ranging A/D converter 100 has a reference circuit 110, a coarse A/D converter (CADC) 120, a fine A/D converter (FADC) 130, a multiplexer 140, and a timing generator 150.

In addition, the sub-ranging A/D converter 100 has an output buffer 160 for the CADC and an output buffer 170 for the FADC.

Figure 2:
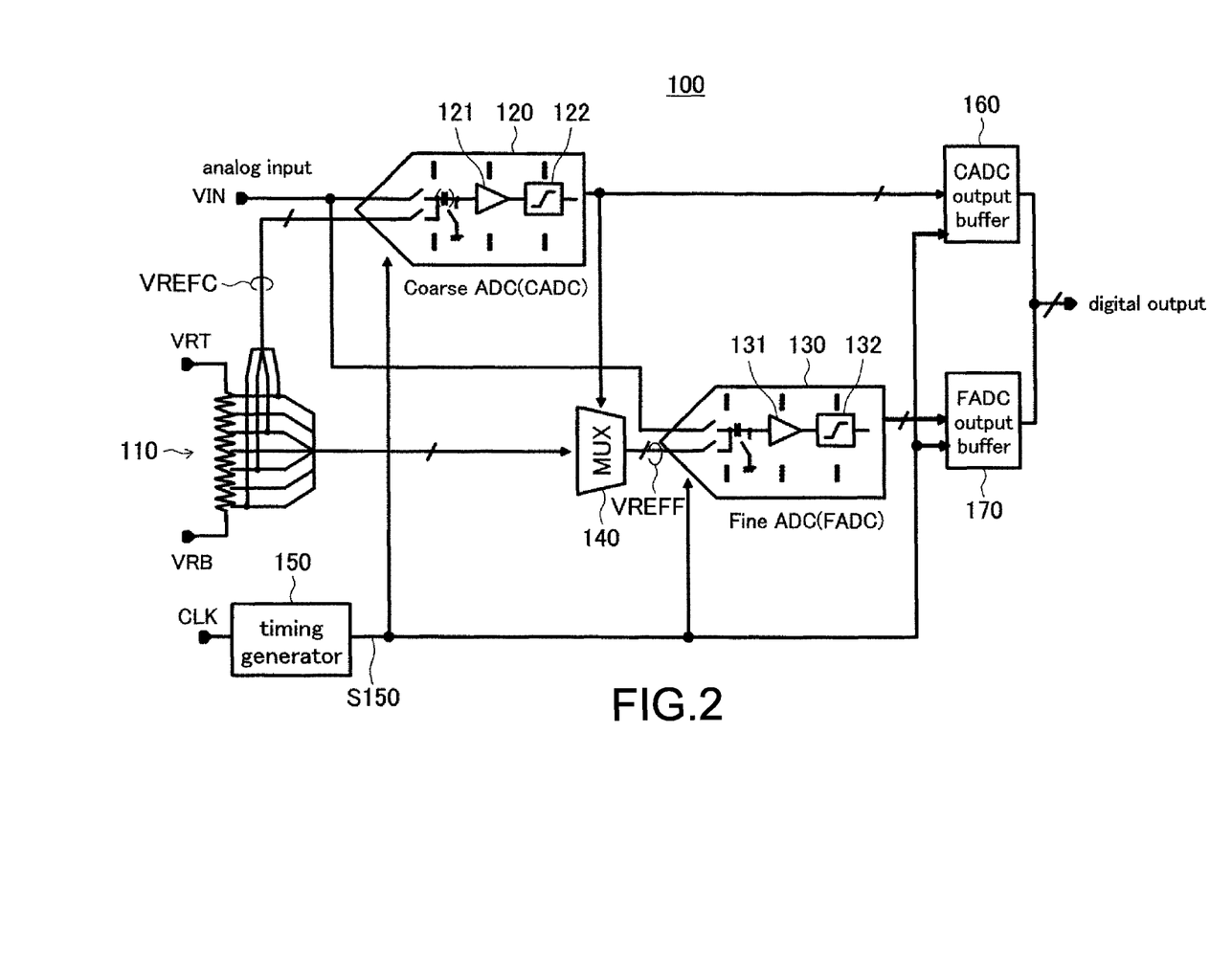
FIG. 2 is a diagram showing a basic entire configuration example of a sub-ranging A/D converter according to an embodiment.
Figure 3:
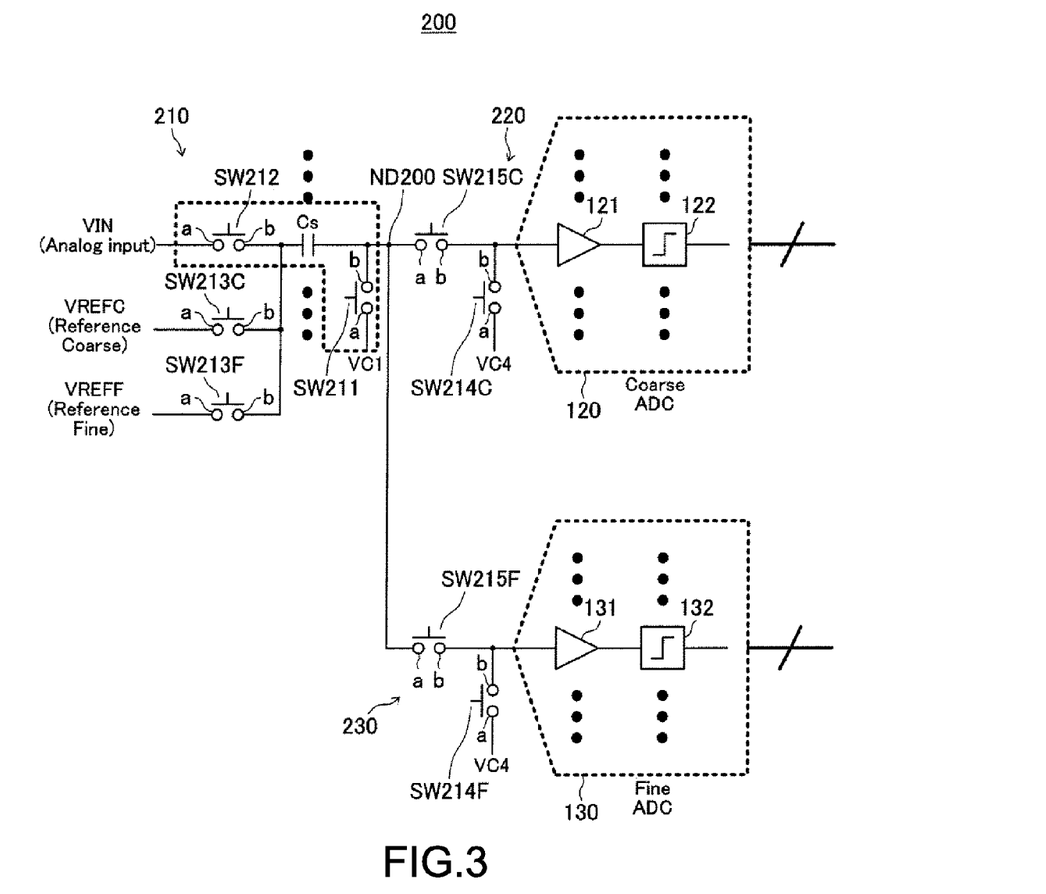
FIG. 3 is a diagram schematically showing an example of a TH circuit shared by a coarse A/D converter (CADC) and a fine A/D converter (FADC) of the sub-ranging A/D converter according to the embodiment.

FIG. 2 shows the basic configuration in which each of the CADC 120 and the FADC 130 has a sampling capacitor Cs. However, as shown in FIG. 3, the sampling capacitor Cs is actually shared according to the FADC 130 that may require accuracy.

As will be described below, a TH (track-and-hold) circuit and the sampling capacitor are partially shared by the CADC 120 and the FADC 130 in the A/D converter 100 according to the embodiment.

The reference circuit 110 is composed of one or more resistor ladders including a plurality of resistors R connected in series between a power supply VRT on a high potential side and a power supply VRB on a low potential side.

The reference circuit 110 supplies to the CADC 120 one or more coarse reference voltages VREFC serving as a reference(s) for the A/D conversion of the CADC 120.

In addition, the reference circuit 110 supplies to the FADC 130 via the multiplexer 140 one or more fine reference voltages VREFF serving as a reference(s) for the A/D conversion of the FADC 120.

As shown in FIG. 2, the CADC 120 converts, when converting an analog input signal (analog input voltage) VIN into an N-bit digital signal, the analog input signal VIN into a high-order m-bit digital signal.

The CADC 120 outputs the high-order m-bit digital signal thus converted to the multiplexer 140 and the output buffer 160.

It should be noted that the CADC 120 includes an amplifier 121 and a binarization circuit 122.

The FADC 130 converts, when converting the analog input signal VIN into the N-bit digital signal, the analog input signal VIN into a low-order n-bit (n=N−m) digital signal based on a conversion result of the CADC 120.

The FADC 130 outputs the low-order n-bit digital signal thus converted to the output buffer 170.

It should be noted that the FADC 130 includes an amplifier 131 and a binarization circuit 132.

The multiplexer 140 includes a plurality of switches arranged in matrix (matrix switches). The multiplexer 140 selects the reference voltage to be supplied from the reference circuit 110 according to the output signal of the CADC 120 and supplies to the FADC 130 the selected reference voltage as the fine reference voltage VREFF.

The timing generator 150 controls the timing of the whole circuit.

The timing generator 150 controls the operation timing of the CADC 120, the FADC 130, and the output buffers 160 and 170 with a signal S150 synchronized with a clock signal CLK.

In the sub-ranging A/D converter 100, the CADC 120 converts the analog input signal VIN into a high-order m-bit digital signal, and the multiplexer 140 determines (selects) the reference voltage to be supplied to the FADC 130 based on a conversion result of the CADC. The FADC 130 converts the analog signal VIN into a low-order n-bit digital signal based on the supplied reference voltage VREF.

(2) Configuration Example of TH Circuit Serving as Substantial Part of Sub-Ranging A/D Converter FIG. 3 is a diagram schematically showing an example of the TH circuit shared by the coarse A/D converter (CADC) and the fine A/D converter (FADC) of the sub-ranging A/D converter according to the embodiment.

According to the embodiment, the TH circuit is configured such that the sampling capacitor Cs configuring the TH circuit is determined based on the FADC 130 that may require accuracy and the sampling capacitor of the CADC 120 that may not require accuracy is determined based on the divided sampling capacitor Cs.

According to the embodiment, the FADC 130 and the CADC 120 share the same sampling capacitor Cs to prevent a sampling error (difference in band and timing) from occurring in the TH circuit 200.

FIG. 2 shows the configuration in which each of the CADC 120 and the FADC 130 has the sampling capacitor Cs. However, as shown in FIG. 3, the sampling capacitor Cs is actually shared according to the FADC 130 that may require accuracy.

According to the embodiment, the TH circuit 200 includes a shared unit 210, a coarse input unit 220, a fine input unit 230, and a common node ND200.

The shared unit 210 includes a first switch SW211, a second switch SW212, a third coarse switch SW213C, a third fine switch SW213F, and the sampling capacitor Cs, all of which are commonly used.

The coarse input unit 220 includes a fourth coarse switch SW214C and a fifth coarse switch SW215C.

The fine input unit 230 includes a fourth fine switch SW214F and a fifth fine switch SW215F.

The first switch SW211 has its terminal a connected to the supply line for a voltage VC1 and its terminal b connected to the terminal a of the fifth coarse switch SW215C, the terminal a of the fifth fine switch SW215F, and one end (first electrode) of the sampling capacitor Cs.

The second switch SW212 has its terminal a connected to the supply line for the analog input signal VIN and its terminal b connected to the other end (second electrode) of the sampling capacitor Cs.

The third coarse switch SW213C has its terminal a connected to the supply line for the one or more coarse reference voltages VREFC supplied from the reference circuit 110 and its terminal b connected to the other end (second electrode) of the sampling capacitor Cs.

The third fine switch SW213F has its terminal a connected to the supply line for the one or more fine reference voltages VREFF supplied from the multiplexer 140 (reference circuit 110) and its terminal b connected to the other end (second electrode) of the sampling capacitor Cs.

The fourth coarse switch SW214C has its terminal a connected to the supply line for a voltage VC4 and its terminal b connected to the terminal b of the fifth coarse switch SW215C and the input of the CADC 120.

The fourth fine switch SW214F has its terminal a connected to the supply line for the voltage VC4 and its terminal b connected to the terminal b of the fifth fine switch SW215F and the input of the FADC 130.

The configuration in which the TH circuit 200 is thus shared (divided) will be described in detail.

In the sub-ranging A/D converter 100 according to the embodiment, the TH circuit that may require higher accuracy (i.e., reduced thermal noise) is divided from a circuit configuration generally having two or more TH circuits to configure the TH circuit shown in FIG. 3 that may not require accuracy.

More specifically, the sampling capacitor Cs of the TH circuit of the FADC 130 has a large capacitance because it depends on desired thermal noise kT/Cs.

On the other hand, the sampling capacitor Cs' of the CADC 120 may have a small capacitance because it allows for low accuracy (thermal noise). Therefore, the sampling capacitor Cs' of the CADC 120 may be configured in such a manner that the sampling capacitor Cs of the TH circuit of the FADC 130 is divided.

In principle, the sampling capacitor Cs is determined based on the accuracy of the FADC 130, and the sampling capacitor of the CADC 120 is determined based on the sampling capacitor Cs' obtained by dividing the sampling capacitor Cs.

Thus, the thermal noise of the FADC 130 kT/Cs (=kT/(Cs'+ ... +Cs')) may be obtained and averaged.

For example, when the CADC 120 has a two-bit configuration and the FADC 130 has a two-bit configuration in a four-bit A/D converter, the TH circuit on the side of the FADC 130 may require the sampling capacitor Cs capable of securing four-bit accuracy.

The sampling capacitor on the side of the CADC 120 may require only two-bit accuracy and thus have its capacitance $\frac{1}{16}$ as small as the capacitance of the sampling capacitor on the side of the FADC 130.

The sampling capacitor on the side of the FADC 130 is reduced to ¼ in size to configure the TH circuit on the side of the CADC 120, and then the divided sampling capacitors are merged together to configure the TH circuit on the side of the FADC 130.

In this manner, noise reduced to ¼ may be averaged to provide the thermal noise kT/C with high accuracy.

In the TH circuit 200 having such a configuration, the analog input signal VIN is sampled by the sampling capacitor Cs when only the switch SW211 and the switch SW212 of the shared unit 210 and the switch 214C of the coarse input unit 220 are turned on.

Then, a comparison voltage compared with the coarse reference voltage VREFC is supplied from the reference circuit to the amplifier AMP121 of the CADC 120 when only the switch SW213C of the shared unit 210 and the switch SW215C of the coarse input unit 220 are turned on.

Next, in the TH circuit 200, the analog input signal VIN is sampled by the sampling capacitor Cs when only the switch SW211 and the switch SW212 of the shared unit 210 and the switch SW214F of the fine input unit 230 are turned on.

Then, a comparison voltage compared with the fine reference voltage VREFF is supplied to the amplifier 131 of the FADC 130 via the multiplexer 140 when only the switch SW213F of the shared unit 210 and the switch SW215F of the fine input unit 230 are turned on.

In this case, the fine reference voltage VREFF is determined (selected) based on the output of the CADC 120. For example, it may also be possible to arrange a plurality of switches SW213F in parallel in the shared unit 210 and selectively turn on and off the switches SW213F based on the output of the CADC 120. In such a configuration, the switches SW213F also have the functions of the multiplexer.

Figure 4:
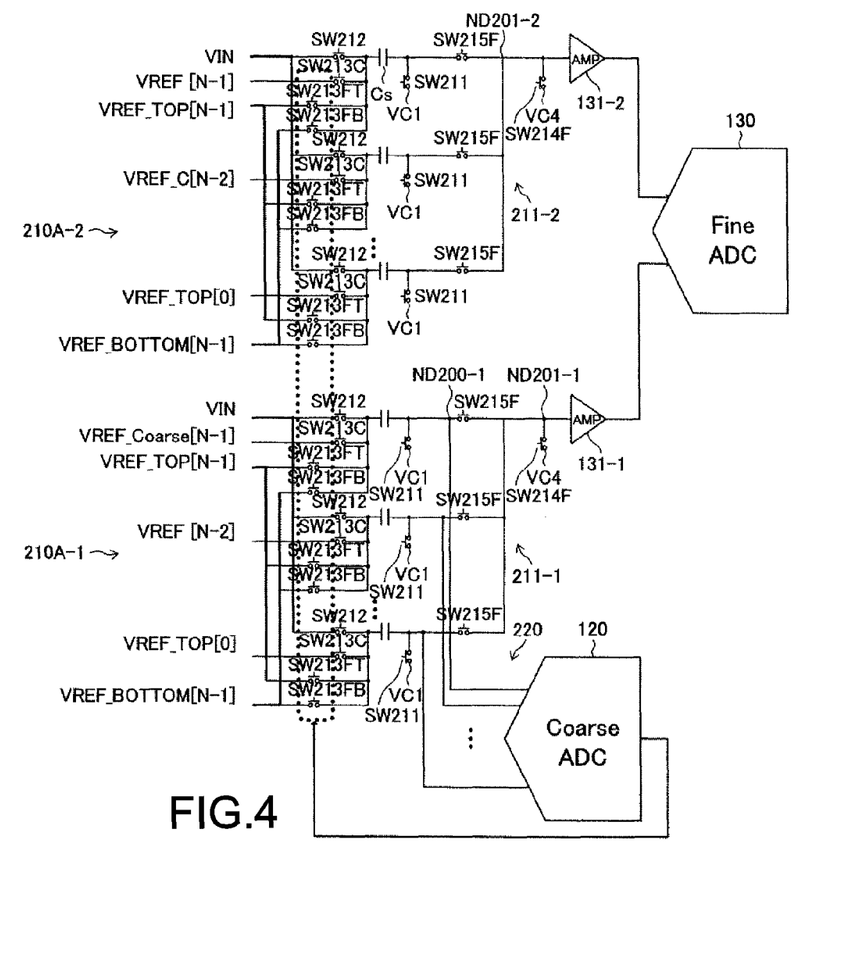
FIG. 4 is a diagram showing a specific example of the TH circuit shared by the coarse A/D converter (CADC) and the fine A/D converter (FADC) of the sub-ranging A/D converter according to the embodiment.

FIG. 4 is a diagram showing a specific example of the TH circuit shared by the coarse A/D converter (CADC) and the fine A/D converter (FADC) of the sub-ranging A/D converter according to the embodiment.

Figure 5:
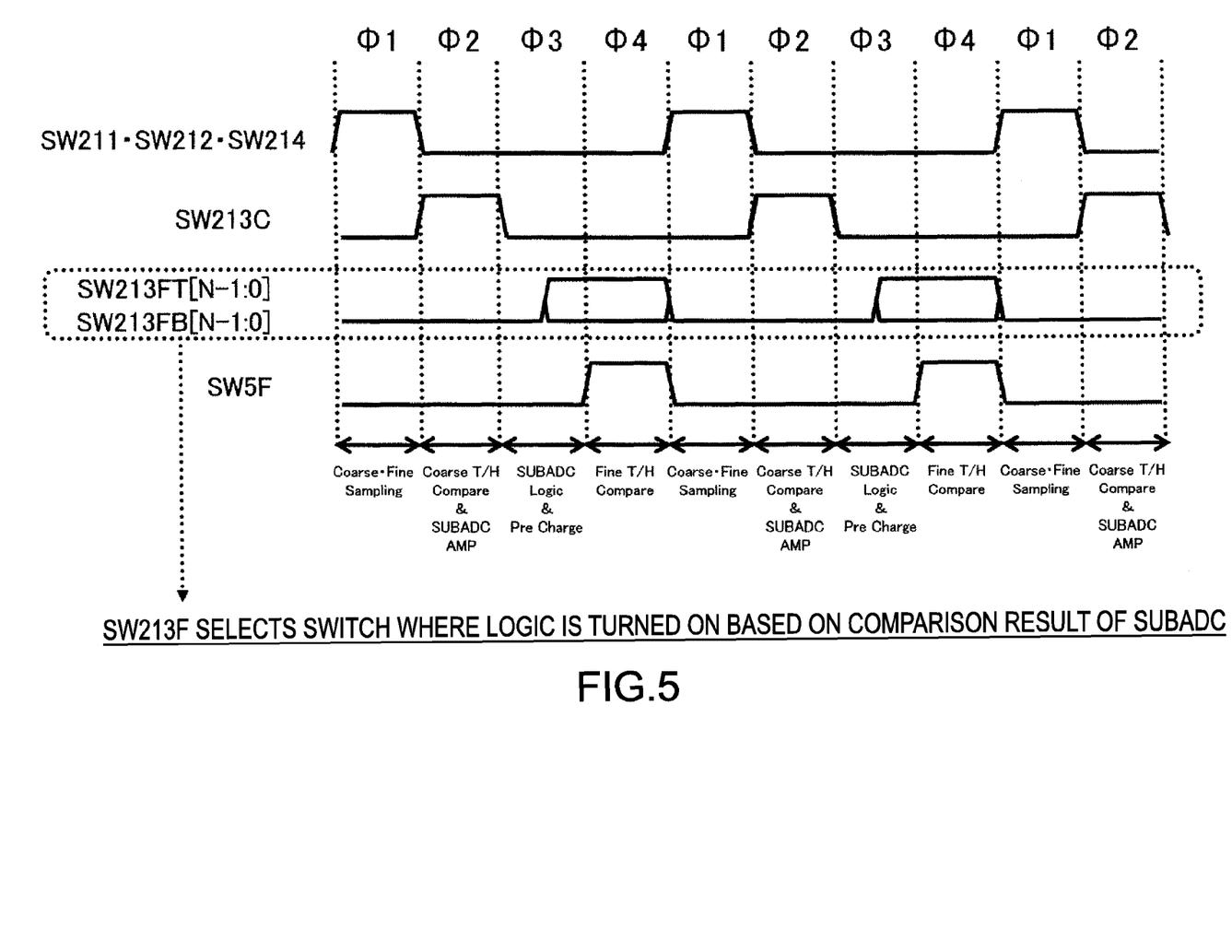
FIG. 5 is a timing chart for explaining the outline of the operations of the TH circuit shown in FIG. 4.

FIG. 5 is a timing chart for explaining the outline of the operations of the TH circuit shown in FIG. 4.

In the TH circuit 200A shown in FIG. 4, the FADC 130 has two inputs, and a shared unit 210A is composed of two systems of shared units 210A-1 and 210A-2.

A plurality of coarse reference voltages VREF_C[N−1], VREF_C[N−2], etc., and a plurality of fine reference voltages VREF_TOP[N'1] to VREF_TOP[0] and VREF_BOTTOM[N−1] to VREF_BOTTOM[0] are supplied to each of the shared units 210A-1 and 210A-2.

Based on this, a plurality of analog input signals VIN and a plurality of input systems of the coarse reference voltages VREFC and the fine reference voltages VREFF are formed to be paired in parallel for each reference voltage level.

The shared units 210A-1 and 210A-2 are configured as follows with connection points between the fifth switches SW215F and the fourth switches SW214F serving as common nodes ND201-1 and ND201-2, respectively.

A plurality of shared sampling units 211-1 and 211-2 are formed, each of which includes the first switch SW211, the second switch SW212, the third coarse switch SW213C, the third fine switch 213F, the fifth switch SW215F, and the sampling capacitor Cs.

In the shared units 210A-1 and 210A-2, the plurality of shared sampling units 211-1 and 211-2 are connected in parallel to the common nodes ND201-1 and ND201-2, respectively.

In the two input units of the FADC 130, amplifiers 131-1 and 131-2 are disposed. The inputs of the amplifiers 131-1 and 131-2 are connected to the common nodes ND201-1 and ND201-2, respectively.

It should be noted that each of the shared sampling units 211-1 and 211-2 includes a third switch SW213FT on the top side T of the reference voltage and a third switch SW213FB on the bottom side B thereof.

In an example of FIG. 4, the fourth coarse switch SW214C and the fifth coarse switch SW215C are not connected to the coarse input unit 220.

In the example of FIG. 4, each of the plurality of input units of the CADC 120 is connected to the plurality of common nodes ND200-1 of the shared unit 210A-1.

In the shared units 210A-1 and 210A-2, the on/off of the third fine switches SW213F of the shared sampling units 211-1 and 211-2 is controlled with the output of the CADC 120.

More specifically, the third fine switches SW213F are selectively turned on and off with the output of the CADC 120 and thus also have the functions of the multiplexer.

In other words, the third fine switches SW213F are selectively turned on and off based on a comparison result of the binarization circuit (comparator) 122 of the CADC 120.

The operations of the TH circuit shown in FIG. 4 will be described in association with FIG. 5.

In a period $\Phi 1$, the analog input signal VIN is sampled by the sampling capacitor Cs when only the switch SW211 and the switch SW212 of the shared unit 210A and the switch SW214C of the coarse input unit 220 are turned on.

Then, in a period $\Phi 2$, the comparison voltage compared with the coarse reference voltage VREFC is supplied from the reference circuit to the amplifier AMP121 of the CADC 120 when only the switch 213C of the shared unit 210A is turned on.

In a period $\Phi 3$, selection processing is performed in the shared units 210A-1 and 210A-2 to control the on/off of each of the third fine switches SW213F of the shared sampling units 211-1 and 211-2 with the output of the CADC 120.

Logic selection processing for the third fine switches SW213FT[N−1:0] and SW213FB[N−1:0] is performed.

Then, in a period $\Phi 4$, the on/off of each of the third fine switches SW213F of the shared sampling units 211-1 and 211-2 is controlled in the shared units 210A-1 and 210A-2 based on a processed selection signal.

Next, the fifth switch SW215F is turned on to perform a comparison operation with the FADC 130.

In the sub-ranging A/D converter 100 according to the embodiment, the CADC 120A and the FADC 130A may share the same sampling capacitor Cs, the first switch SW211, and the second switch SW212 and completely prevent a sampling error from occurring therebetween.

More specifically, unlike typical methods, the coarse TH circuit and the fine TH circuit are merged together to eliminate a difference in band and sampling timing per se between the TH circuits.

Because of this, it becomes possible to remove restrictions on input bands resulting from a difference in band and sampling timing between the TH circuits and to reduce difficulty in design.

Moreover, calculation is performed by all the sampling capacitors to generate a low-order (fine) analog signal, which reduces the kT/C noise and determines the capacitance of the sampling capacitor only on the low-order (fine) side that may require accuracy.

More specifically, the total capacitance of the TH circuit is only equivalent to the capacitance that may be required on the low-order side, which reduces the area of the A/D converter 100.

In addition, if the number (bit number) of the TH circuits of the FADC is smaller than that of the TH circuits of the CADC, the sampling capacitors may be merged together, which increases the sampling capacitor Cs for fine comparison and reduces (averages) the kT/C noise.

(3) Configuration Example of Signal Processing System

Figure 6:
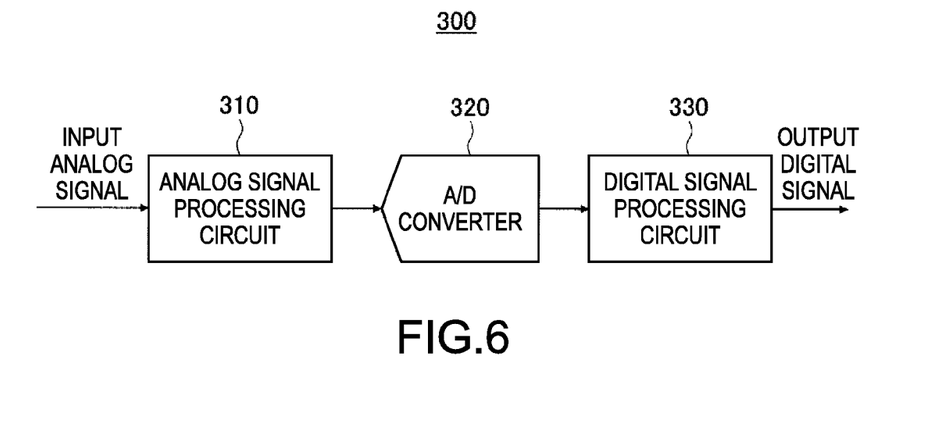
FIG. 6 is a block diagram showing a configuration example of a signal processing system according to the embodiment.

FIG. 6 is a block diagram showing a configuration example of a signal processing system according to the embodiment.

The signal processing system 300 is formed to be a signal processing system to which the A/D converter 100 according to the embodiment is applicable. Examples of the signal processing system 300 include a camera signal processing system, etc.

The signal processing system 300 includes an analog signal processing circuit 310, an A/D converter 320, and a digital signal processing circuit 330.

In the signal processing system 300, the A/D converter 100 according to the embodiment is applicable as the A/D converter 320.

In the signal processing system 300 shown in FIG. 6, signal processing is performed by the digital signal processing circuit 330 to a greater extent to reduce the analog signal processing circuit 310 in size, which expects the downsizing and high efficiency of the signal processing system 300.

Here, in order to achieve the above system, i.e., in order for the digital signal processing circuit 330 to perform the signal processing performed by the analog signal processing circuit 310, the digital signal processing circuit 330 may be required to perform A/D conversion without damaging information on an original signal to a greater extent. For this reason, an A/D converter having a high SN ratio may be required.

The above embodiment is described using a single operation as an example, but both of the single operation and a differential operation are applicable to the embodiment.

It should be noted that the present disclosure may employ the following configurations.

(1) An analog-to-digital (A/D) converter, including:

a coarse analog-to-digital (A/D) converter configured to convert, when converting an analog input signal into an N-bit digital signal, the analog input signal into a high-order m-bit digital signal;

a fine analog-to-digital (A/D) converter configured to convert the analog input signal into a low-order n-bit (where n=N−m) digital signal based on a conversion result of the coarse A/D converter; and a track-and-hold (TH) circuit configured
to sample the analog input signal,
to supply a comparison voltage compared with a coarse reference voltage to the coarse A/D converter, and
to supply a comparison voltage compared with a fine reference voltage based on a conversion result of the fine A/D converter to the fine A/D converter, in which
the TH circuit is configured to share a sampling capacitor in a selective input path for the analog input signal, the coarse reference voltage, and the fine reference voltage.

(2) The A/D converter according to Item (1), in which
a capacitance of the shared sampling capacitor is determined based on accuracy of the fine A/D converter.

(3) The A/D converter according to Item (2), in which
the shared sampling capacitor is configured to serve as a sampling capacitor of the coarse A/D converter in such a manner that the capacitance determined based on the accuracy of the fine A/D converter is divided.

(4) The A/D converter according to any one of Items (1) to (3), in which
the TH circuit includes
a common node,
a shared unit having the sampling capacitor and connected between the common node and a supply line for the analog input signal, the coarse reference voltage, and the fine reference voltage,
a coarse input unit connected between the common node and an input of the coarse A/D converter, and
a fine input unit connected between the common node and an input of the fine A/D converter.

(5) The A/D converter according to Item (4), in which
the shared unit includes
the sampling capacitor having its one end connected to the common node,
a first sampling switch connected between the one end of the sampling capacitor and a voltage source,
a second sampling switch connected between the other end of the sampling capacitor and the supply line for the analog input signal,
a third coarse switch connected between the other end of the sampling capacitor and the supply line for the coarse reference voltage, and
a third fine switch connected between the other end of the sampling capacitor and the supply line for the fine reference voltage, and
the fine input unit includes
a fourth fine switch connected between the input of the fine A/D converter and a voltage source, and
a fifth fine switch connected between the common node and the input of the fine A/D converter.

(6) The A/D converter according to Item (4), in which
the coarse input unit includes
a fourth coarse switch connected between the input of the coarse A/D converter and a voltage source, and
a fifth coarse switch connected between the common node and the input of the coarse A/D converter.

(7) The A/D converter according to Item (5), in which
the TH circuit includes
at least one common node connected to the fourth fine switch and the input of the fine A/D converter, and
a plurality of shared sampling units each having the common node, the sampling capacitor, the first sampling switch, the second sampling switch, the third coarse switch, the third fine switch, and the fifth fine switch,
each of the plurality of shared sampling units being commonly connected to the common node via the fifth fine switch, and
the coarse A/D converter has
a plurality of its inputs connected to the common nodes of the plurality of shared sampling units.

(8) The A/D converter according to any one of Items (5) to (7), in which
on/off of the third fine switch is controlled based on the conversion result of the coarse A/D converter.

(9) The A/D converter according to any one of Items (5) to (8), in which
the first sampling switch, the second sampling switch, and the fourth coarse/fine switches are turned on while the third coarse/fine switches and the fifth coarse/fine switches are turned off when the analog input signal is sampled, and
the first sampling switch, the second sampling switch, and the fourth coarse/fine switches are turned off while the third coarse/fine switches and the fifth coarse/fine switches are turned on when the coarse/fine reference voltages are input to obtain the corresponding comparison voltages.

(10) A signal processing system including
an analog-to-digital (A/D) converter configured to convert an analog signal supplied from an analog signal processing system into a digital signal, the A/D converter including
a coarse analog-to-digital (A/D) converter configured to convert, when converting an analog input signal into an N-bit digital signal, the analog input signal into a high-order m-bit digital signal,
a fine analog-to-digital (A/D) converter configured to convert the analog input signal into a low-order n-bit (where n=N−m) digital signal based on a conversion result of the coarse A/D converter, and
a track-and-hold (TH) circuit configured
to sample the analog input signal,
to supply a comparison voltage compared with a coarse reference voltage to the coarse A/D converter, and
to supply a comparison voltage compared with a fine reference voltage based on a conversion result of the fine A/D converter to the fine A/D converter, in which
the TH circuit is configured to share a sampling capacitor in a selective input path for the analog input signal, the coarse reference voltage, and the fine reference voltage.

The present disclosure contains subject matter related to that disclosed in Japanese Priority Patent Application JP 2011-094214 filed in the Japan Patent Office on Apr. 20, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital (A/D) converter, comprising:
a coarse analog-to-digital (A/D) converter configured to convert, when converting an analog input signal into an N-bit digital signal, the analog input signal into a high-order m-bit digital signal;
a fine analog-to-digital (A/D) converter configured to convert the analog input signal into a low-order n-bit (where n=N−m) digital signal based on a conversion result of the coarse A/D converter; and
a track-and-hold (TH) circuit configured
to sample the analog input signal, to supply a comparison voltage compared with a coarse reference voltage to the coarse A/D converter, and to supply a comparison voltage compared with a fine reference voltage based on a conversion result of the fine A/D converter to the fine A/D converter, wherein the TH circuit is configured to share a sampling capacitor in a selective input path for the analog input signal, the coarse reference voltage, and the fine reference voltage.

2. The A/D converter according to claim 1, wherein a capacitance of the shared sampling capacitor is determined based on accuracy of the fine A/D converter.

3. The A/D converter according to claim 2, wherein the shared sampling capacitor is configured to serve as a sampling capacitor of the coarse A/D converter in such a manner that the capacitance determined based on the accuracy of the fine A/D converter is divided.

4. The A/D converter according to claim 1, wherein the TH circuit includes
   a common node,
   a shared unit having the sampling capacitor and connected between the common node and a supply line for the analog input signal, the coarse reference voltage, and the fine reference voltage,
   a coarse input unit connected between the common node and an input of the coarse A/D converter, and
   a fine input unit connected between the common node and an input of the fine A/D converter.

5. The A/D converter according to claim 4, wherein the shared unit includes
   the sampling capacitor having one end thereof connected to the common node,
   a first sampling switch connected between the one end of the sampling capacitor and a voltage source,
   a second sampling switch connected between the other end of the sampling capacitor and the supply line for the analog input signal,
   a third coarse switch connected between the other end of the sampling capacitor and the supply line for the coarse reference voltage, and
   a third fine switch connected between the other end of the sampling capacitor and the supply line for the fine reference voltage, and
   the fine input unit includes
   a fourth fine switch connected between the input of the fine A/D converter and a voltage source, and
   a fifth fine switch connected between the common node and the input of the fine A/D converter.

6. The A/D converter according to clam 4, wherein the coarse input unit includes
   a fourth coarse switch connected between the input of the coarse A/D converter and a voltage source, and
   a fifth coarse switch connected between the common node and the input of the coarse A/D converter.

7. The A/D converter according to claim 5, wherein the TH circuit includes
   at least one common node connected to the fourth fine switch and the input of the fine A/D converter, and
   a plurality of shared sampling units each having the common node, the sampling capacitor, the first sampling switch, the second sampling switch, the third coarse switch, the third fine switch, and the fifth fine switch,
      each of the plurality of shared sampling units being commonly connected to the common node via the fifth fine switch, and
   the coarse A/D converter has
      a plurality of inputs thereof connected to the common nodes of the plurality of shared sampling units.

8. The A/D converter according to claim 5, wherein on/off of the third fine switch is controlled based on the conversion result of the coarse A/D converter.

9. The A/D converter according to claim 6, wherein the first sampling switch, the second sampling switch, and the fourth coarse/fine switches are turned on while the third coarse/fine switches and the fifth coarse/fine switches are turned off when the analog input signal is sampled, and
the first sampling switch, the second sampling switch, and the fourth coarse/fine switches are turned off while the third coarse/fine switches and the fifth coarse/fine switches are turned on when the coarse/fine reference voltages are input to obtain the corresponding comparison voltages.

10. A signal processing system, comprising
an analog-to-digital (A/D) converter configured to convert an analog signal supplied from an analog signal processing system into a digital signal, the A/D converter including
   a coarse analog-to-digital (A/D) converter configured to convert, when converting an analog input signal into an N-bit digital signal, the analog input signal into a high-order m-bit digital signal,
   a fine analog-to-digital (A/D) converter configured to convert the analog input signal into a low-order n-bit (where n=N−m) digital signal based on a conversion result of the coarse A/D converter, and
   a track-and-hold (TH) circuit configured
      to sample the analog input signal,
      to supply a comparison voltage compared with a coarse reference voltage to the coarse A/D converter, and
      to supply a comparison voltage compared with a fine reference voltage based on a conversion result of the fine A/D converter to the fine A/D converter, wherein
   the TH circuit is configured to share a sampling capacitor in a selective input path for the analog input signal, the coarse reference voltage, and the fine reference voltage.

* * * * *